(12) United States Patent
Williams et al.

(10) Patent No.: US 6,204,704 B1
(45) Date of Patent: Mar. 20, 2001

(54) MICROPOWER, MINIMAL AREA DC SENSING POWER-UP RESET CIRCUIT

(75) Inventors: Michael G. Williams, Allentown; Jonathan Herman Fischer, Blandon, both of PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/366,615

(22) Filed: Aug. 3, 1999

(51) Int. Cl.[7] .................................................. H03L 7/00
(52) U.S. Cl. ............................................. 327/143; 327/198
(58) Field of Search ..................................... 327/143, 198

(56) References Cited

U.S. PATENT DOCUMENTS

| | | | |
|---|---|---|---|
| 5,073,874 | * 12/1991 | Yamada et al. | 365/226 |
| 5,111,067 | * 5/1992 | Wong et al. | 307/272.3 |
| 5,767,710 | * 6/1998 | Cho | 327/143 |
| 5,942,925 | * 8/1999 | Stahl | 327/143 |
| 6,052,006 | * 4/2000 | Talaga, Jr. et al. | 327/143 |

* cited by examiner

Primary Examiner—Kenneth B. Wells
Assistant Examiner—Cassandra Cox
(74) Attorney, Agent, or Firm—Duane, Morris & Heckscher LLP

(57) ABSTRACT

An integrated circuit including a DC sensing power-up reset (PUR) circuit and method for generating a reset signal. The PUR circuit comprises a first terminal for receiving a supply voltage and a second terminal for receiving a reference voltage corresponding to a low logic state. A first transistor is coupled between the first terminal and a first node, wherein the first transistor switches on when the supply voltage is rising and exceeds a rising trip point voltage. A second transistor is coupled between the first terminal and the first node, and switches off when the supply voltage falls below a falling trip point voltage which is less than the rising trip point voltage. A first inverter is coupled at an input terminal to the first node and at an output terminal to a second node. A resistor is coupled between the first node and the second terminal. The resistor pulls the first node down to the reference voltage while the first and second transistors are both off and limits current flowing through the first and second transistors while either or both of the first and second transistors is on.

21 Claims, 4 Drawing Sheets

100

200

300

400

500

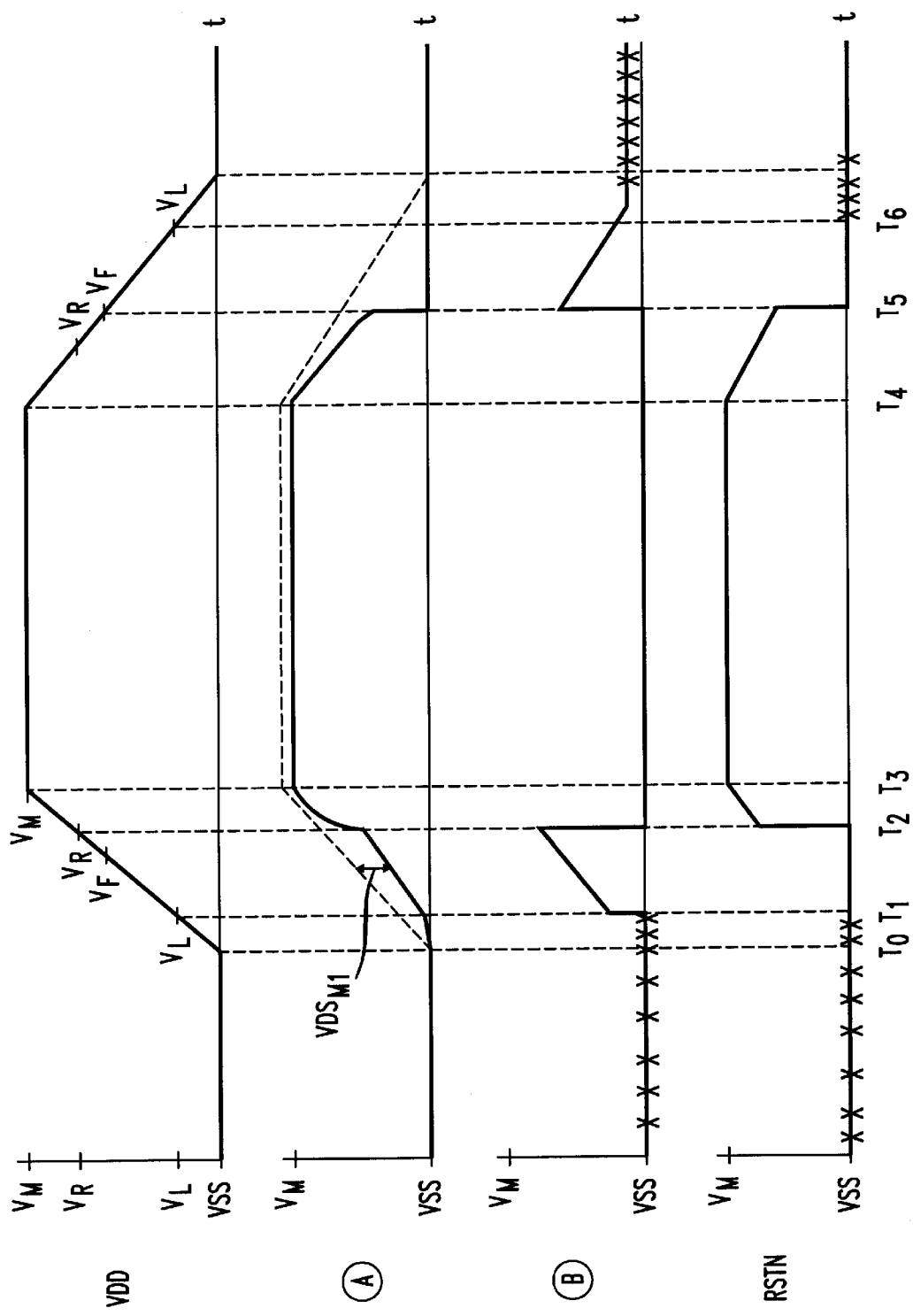

MICROPOWER, MINIMAL AREA DC SENSING POWER-UP RESET CIRCUIT

CROSS-REFERENCE TO RELATED APPLICATION

This Application is related to commonly-owned U.S. patent application Ser. No. 09/366,614 entitled "Power Up Reset Circuit for Line Powered Circuit, " filed on Aug. 3,1999the entirety of which is incorporated herein by reference.

BACKGROUND OF THE INVENTION

1. Field of the Invention

The present invention relates to power-up reset (PUR) circuits and, in particular, to micropower, minimal area DC sensing PUR circuits for use in monolithic CMOS-based integrated circuits (ICs).

2. Description of the Related Art

For many types of integrated circuits (ICs), power is applied to a sleeping or unpowered IC during a "power-up" phase, during which the power supply $V_{DD}$ increases from 0V to a maximum $V_M$ (i.e., the normal operating value of $V_{DD}$). During this phase, it is often desirable to reset certain circuit elements, such as logic flip-flops and memory shift registers, to some predetermined initial state, to initialize the IC, until the power supply voltage $V_{DD}$ reaches a sufficient level for reliable operation. In order to do this, it is desirable to have a reset signal generated (RST or, for active-low designs, RSTN) during the power-up phase. The reset signal is applied to appropriate control inputs of various circuit elements to keep them in an initial or reset state until the reset signal changes upon the supply voltage reaching a certain threshold. In this manner, various circuit elements of the IC start operation in a predictable state and after a sufficient supply voltage is present.

Power-up reset (PUR) circuits are typically utilized to generate this reset signal. A PUR circuit supplies a reset voltage signal to the various circuit elements, and is coupled to the $V_{DD}$ power supply rail, as are other components of the IC. The reset signal (RST or RSTN, depending on whether the PUR circuit is active high or low in design) is output on a output terminal or line of the PUR circuit. PUR circuits often comprise complementary metal-oxide semiconductor (CMOS) fabricated components, such as CMOS field-effect transistors (CMOS FETs). Digital signals in such systems typically represent a bit of data, that is, a logic–0 or logic–1, sometimes referred to as low or high, respectively, corresponding to the low voltage state (typically $V_{ss}$, e.g. ground= 0V)) or the high voltage state (typically $V_{DD}$, e.g. 3–5V, or some other intermediate value while $V_{DD}$ is ramping up). Thus, the reset signal may have either a high state or low state at any time. The reset signal may be active high or active low, which determines whether the high state or the low state, respectively, is considered to be "asserting" the reset signal.

It is generally desirable for the PUR circuit to be formed on the IC chip having the circuit elements requiring initialization. However, this requires that some of the IC area be devoted to the PUR circuit instead of other components. It is therefore also desirable to have the PUR circuit occupy as little area on the chip as possible. It is also often desirable to have the PUR circuit draw as small a current as possible during operation. For example, it may be desirable to achieve micropower operation of the PUR circuit, i.e. to have the PUR circuit draw less than $1\mu A$ of DC current during operation.

Unfortunately, conventional micropower DC sensing PUR circuits typically have at least three DC paths and thus can require a prohibitively large amount of IC area. Referring now to FIG. 1, there is shown a circuit diagram of a conventional DC sensing PUR circuit 100. PUR circuit 100 is coupled to power supply rail terminals $V_{DD}$ and $V_{SS}$, and outputs an active-low reset signal RSTN at an output terminal or node when a sufficient DC level of $V_{DD}$ is sensed by circuit 100. Although PUR circuit 100 can be configured for micropower operation, it has three DC paths (currents $I_{DC1}$, $I_{DC2}$, and $I_{DC3}$) and thus requires a large amount of area for the transistors $M_1$ and $M_4$ and the two resistors $R_1$, $R_2$ to achieve micropower operation.

Another type of PUR circuit is the transient sensing PUR circuit. Referring now to FIG. 2, there is shown a simplified circuit diagram of a conventional transient sensing PUR circuit 200. PUR circuit 200 comprises only two inverters $I_1$, $I_2$, one resistor $R_1$, and one capacitor $C_1$. Such transient PUR circuits do not require as much IC area because they do not have DC paths and thus do not require as many components or elements. Instead, such transient sensing PUR circuits are sensitive to the $V_{DD}$ ramp rate as well as the DC level of the $V_{DD}$ power supply. Micropower operation can be achieved because there are no DC paths. Unfortunately, because PUR circuit 200 is sensitive to the $V_{DD}$ ramp rate in addition to its level, it is subject to unpredictable behavior and thus is not as robust as typical DC sensing PUR circuits. A marginal increase in robustness requires a large increase in complexity, and thus cost and IC area.

Accordingly, there is a need for a robust micropower PUR circuit which requires a comparatively small amount of IC area.

SUMMARY

An integrated circuit comprising a DC sensing power-up reset (PUR) circuit and method for generating a reset signal. The PUR circuit comprises a first terminal for receiving a supply voltage and a second terminal for receiving a reference voltage corresponding to a low logic state. A first transistor is coupled between the first terminal and a first node, wherein the first transistor switches on when the supply voltage is rising and exceeds a rising trip point voltage. A second transistor is coupled between the first terminal and the first node, and switches off when the supply voltage falls below a falling trip point voltage which is less than the rising trip point voltage. A first inverter is coupled at an input terminal to the first node and at an output terminal to a second node. A resistor is coupled between the first node and the second terminal. The resistor pulls the first node down to the reference voltage while the first and second transistors are both off and limits current flowing through the first and second transistors while either or both of the first and second transistors is on.

BRIEF DESCRIPTION OF THE DRAWINGS

FIG. 6 shows ***illustrative waveforms showing the operation of the PUR circuits of FIG. 3 and 4.

DESCRIPTION OF THE PREFERRED EMBODIMENT

Figure 1:
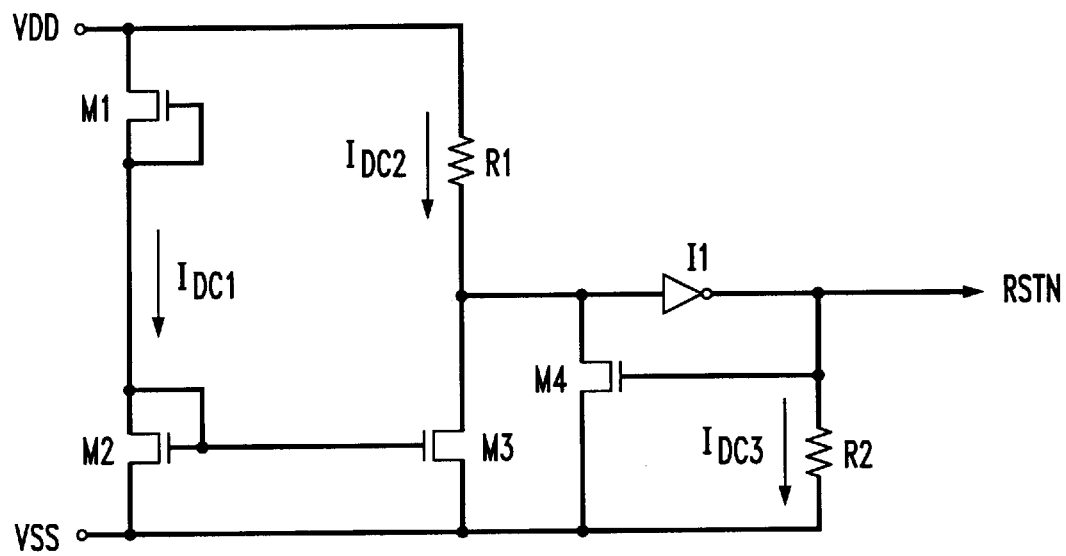
FIG. 1 is a circuit diagram of a conventional DC sensing power-up reset (PUR) circuit.
Figure 2:
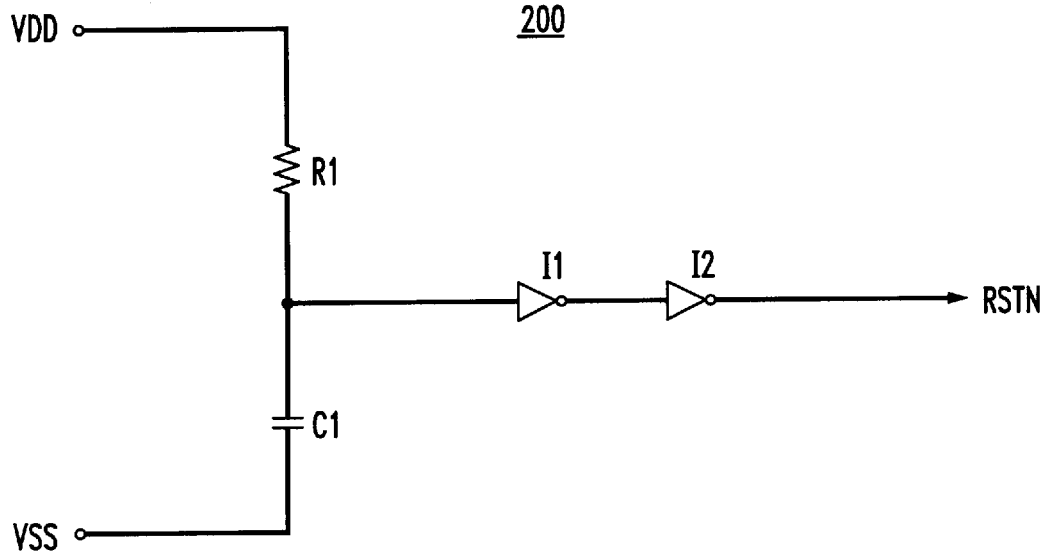
FIG. 2 is a circuit diagram of a conventional transient sensing PUR circuit.

The present invention provides a micropower DC sensing PUR circuit having only one DC path, as described in further detail below. Because the PUR circuit of the present invention is DC sensing instead of transient sensing, its operation is independent of the $V_{DD}$ ramp rate, and it is thus more robust than a typical small-area transient sensing PUR circuit. In addition, only one DC path is employed, so that the amount of IC area required is reduced, relative to typical DC sensing PUR circuits such as PUR circuit 100 of FIG. 1. Having only one DC path also allows the PUR circuit of the present invention to more easily be configured to draw a small amount of current. Two embodiments of the micropower DC sensing PUR circuit of the present invention are described below with reference to FIGS. 3 and 4, one for higher supply voltages and one for lower supply voltages, respectively.

Figure 3:
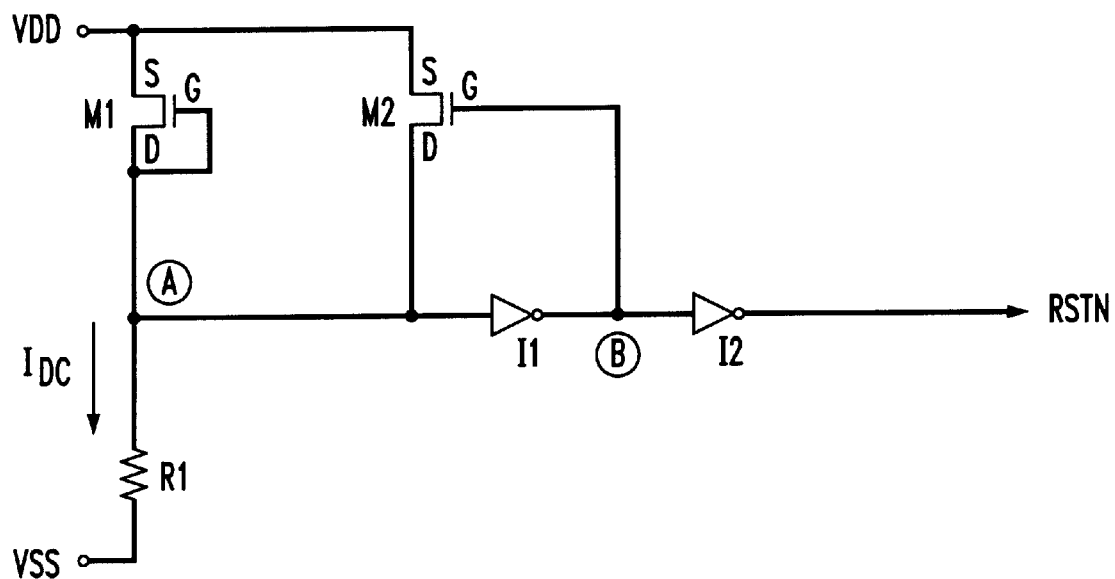
FIG. 3 is a circuit diagram of a high-voltage embodiment of a DC sensing PUR circuit, in accordance with an embodiment of the present invention.
Figure 4:
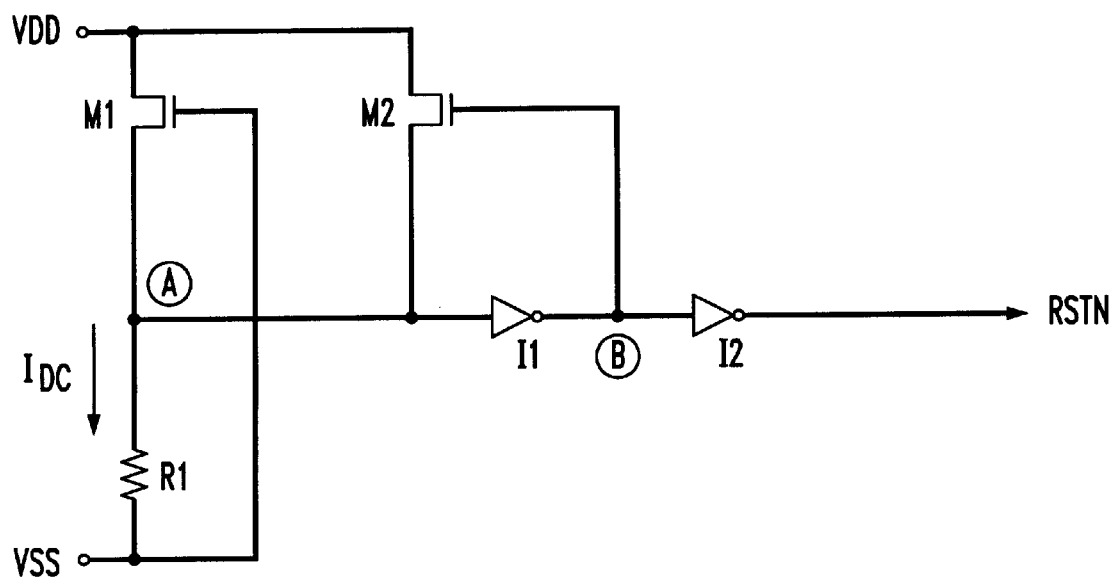
FIG. 4 is a circuit diagram of a low-voltage embodiment of a DC sensing PUR circuit, in accordance with an embodiment of the present invention.

Referring now to FIG. 3, there is shown a circuit diagram of a high-voltage DC sensing PUR circuit 300, in accordance with an embodiment of the present invention. PUR circuit 300 is suitable, in one embodiment, for higher supply voltages (e.g., for $V_{DD} \geq 3V$). Referring now to FIG. 4, there is shown a circuit diagram of a low-voltage DC sensing PUR circuit 400, in accordance with an embodiment of the present invention. PUR circuit 400 is suitable, in one embodiment, for lower supply voltages (e.g., for $V_{DD} \leq 3V$). ICs employing PUR circuits 300, 400 may be used in a variety of applications, such as the telephone line powered circuit described in commonly-owned U.S. patent application entitled "Power Up Reset Circuit for Line Powered Circuit," filed on even date herewith, the entirety of which is incorporated herein by reference.

Referring once more to FIG. 3, the operation of PUR circuit 300 will be described. PUR circuit 400 operates almost identically to PUR circuit 300, and thus the following description of the operation of circuit 300 also applies, in most respects, to PUR circuit 400, except for the gate coupling of transistor $M_1$, which is diode-coupled in circuit 300 but directly-coupled to $V_{SS}$ in circuit 400, for power-supply level reasons as described in further detail below.

PUR circuit 300 has only one DC path (for current $I_{DC}$), as opposed to three for prior art PUR circuit 100; and thus requires less IC area because it has fewer components. In particular, PUR circuit 300 comprises one resistor $R_1$ (as opposed to two in circuit 100), two pmos (p-channel) transistors $M_1$, $M_2$ (as opposed to four in circuit 100), and two inverters $I_1$, $I_2$ (as opposed to only one in circuit 100). Inverters typically require a minimal amount of area in comparison to resistors and transistors in the DC paths. Thus, even though PUR circuit 300 of the present invention comprises one additional inverter over the design of conventional PUR circuit 100, the overall area is greatly reduced by comparison because of the smaller number of resistors and transistors utilized in the DC path, and the power consumption is reduced, in any event, because there is only one DC current path. In one embodiment, the area of PUR circuits 300 and 400 was a factor of 4 to 8 times smaller than for conventional DC sensing PUR circuit 100.

$V_{DD}$ reaches a maximum steady-state voltage $V_M = 5V$, for example (or 2.5V for circuit 400). It is desired that the output reset signal RSTN on the output terminal of inverter $I_2$ remain low, i.e. $V_{SS}$, when $V_{DD}$ is between 0V and some rising threshold $V_R$, known as the rising trip point of the circuit. In particular, it is important that the reset signal be an uninterrupted low ($V_{SS}$) signal from just before the first component turns on (when $V_{DD}$ reaches $V_L$, the voltage sufficient to turn on digital logic circuits) until after the rising trip point ($V_R$) is reached. This time period may be referred to as the reset period. $V_R$ should be less than the ultimate steady-state $V_{DD}$ value, so that $V_L < V_R < V_M$. Typical values for these magnitudes are: $V_L = 1.5V$; $V_R = 2.2V$; $V_M = 5V$.

$V_{DD}$ is typically provided by some power supply external to the IC, such as a battery. In this application, the negative potential to which $V_{DD}$ is referenced is $V_{SS}$. This may be ground, or may be some actual voltage (e.g., a negative voltage) supplied by an external power supply. In both cases, $V_{SS}$/ground may be referred to as a reference voltage.

Whenever RSTN is low (i.e., during the reset period), because active-low is utilized, the circuit is said to be in its active state, and the reset signal RSTN is thus considered as being "asserted" when RSTN is logic low or 0. During the reset period, any component coupled to the reset signal remains reset or initialized. Typically, the rising threshold or trip point $V_R$ is selected to be some amount (e.g. 300–700 mV) above the logic voltage $V_L$. When circuit 300 causes the reset signal voltage at terminal RSTN to rise, the circuit is in its non-active state, i.e. the reset signal is no longer asserted and logic components coupled to the reset signal can begin to function, at a time when $V_{DD}$ is certain to be high enough at this point to allow these components to function.

Thus, upon power-up, the reset signal will transition from low to high whenever $V_{DD}$ rises above the rising threshold or trip point voltage $V_R$. To provide for noise immunity, stability, and robustness of operation, hysteresis is preferably provided in that the falling trip point $V_F$ is some amount lower than the rising trip point, e.g. for a rising trip point of $V_R = 2.2V$, a falling trip point of $V_F = 1.8V$ may be selected. In an embodiment, $V_F$ is preferably selected so that it is greater than $V_L$. In such an embodiment, $V_L < V_F < V_R < V_M$.

Figure 5:
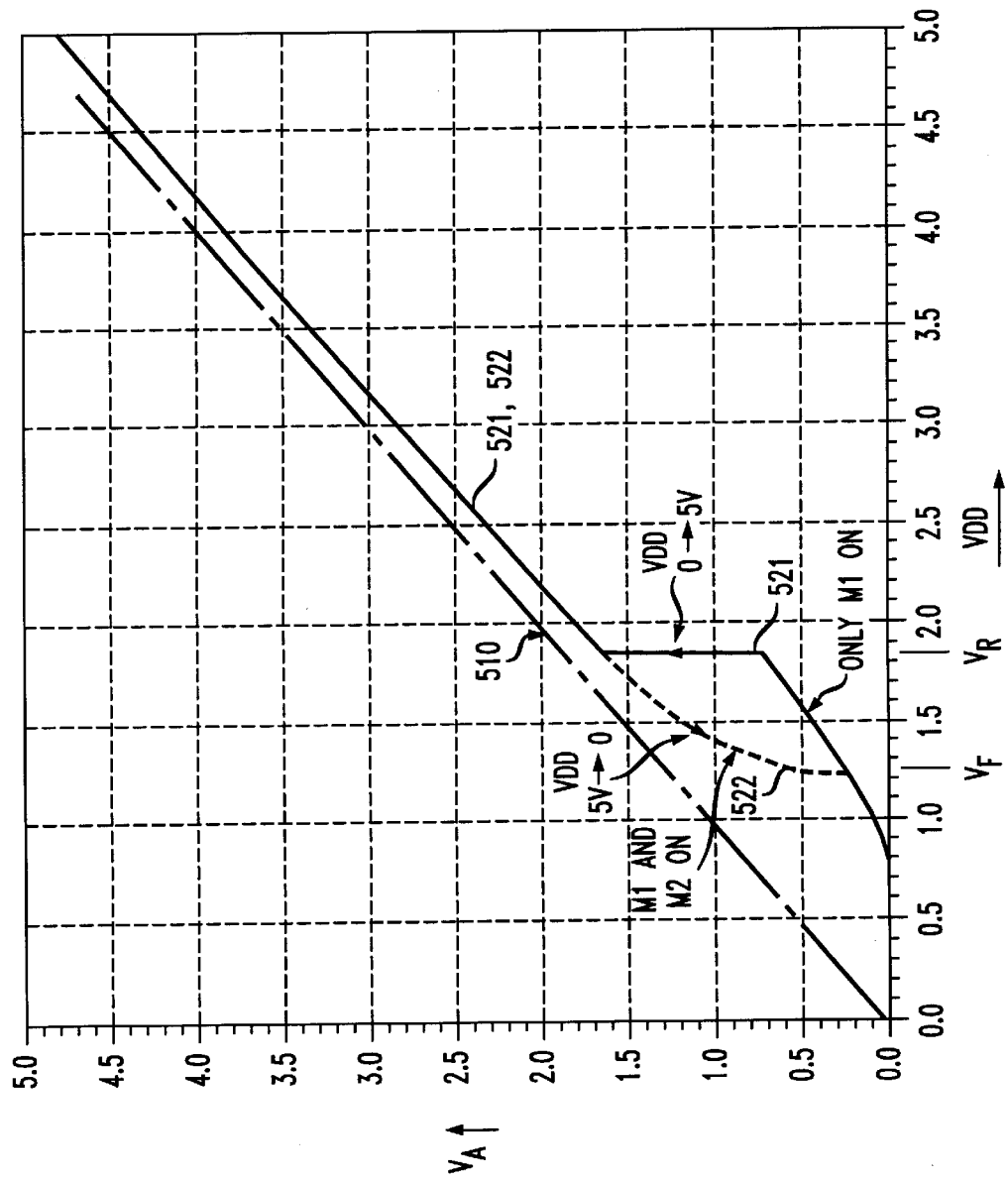
FIG. 5 is a graph of a key circuit node voltage with respect to both increasing and decreasing power supply voltage, for illustrating the operation of the PUR circuits of FIG. 3 and 4.

Referring now to FIG. 5, there is shown a graph 500 of a key circuit node voltage with respect to both increasing and decreasing power supply voltage, for illustrating the operation of PUR circuits 300 and 400. In particular, graph 500 contains supply voltage $V_{DD}$ curve 510, which linearly increases from 0V to 5V or decreases from 5V to 0V. Supply voltage $V_{DD}$ curve 510 also serves as the x-axis for the plot. The node A voltage ($V_A$) which is produced when supply voltage $V_{DD}$ increases from 0V to 5V is illustrated in increasing node voltage curve 521, and the node A voltage $V_A$ which is produced when supply voltage $V_{DD}$ decreases from 5V to 0V is illustrated in decreasing node voltage curve 522. Graph 500 also illustrates the hysteresis in node voltage A caused by the difference in rising trip point voltage $V_R$ and falling trip point voltage $V_F$.

When $V_{DD}$ rises from 0V, transistor $M_1$ starts to conduct at about $V_{DD} = 0.75V$, in the example illustrated in graph 500. This is approximately the threshold voltage of $M_1$. Inverter $I_1$ is not fully operational yet since it needs $V_{DD}$ to be larger than the sum of the n-ch ($V_{TN}$) and p-ch ($V_{TP}$) threshold voltages. As an increasing $V_{DD}$ exceeds about 1.5V (i.e., approximately the value of $V_{TN} + V_{TP}$, in the illustrated example), inverter $I_1$ starts to function. At this point, $V_{DD} = 1.5V$. The switching threshold for inverter $I_1$ is approximately $V_{DD}/2$, so for $V_A$ <switching threshold$\approx V_{DD}/2$, the inverter $I_1$ output (node B) is a logic high, and for $V_A$ >switching threshold$\approx V_{DD}/2$, its output will go low. For the example shown in FIG. 5, $V_{DD}$ must increase to about 1.85V for $M_1$ to pull node A up to the switching point of inverter $I_1$. Thus, $V_R = 1.85V$ in this example. Once the inverter output (node B) goes low (when $V_{DD}$ reaches $V_R$), transistor $M_2$ also turns on to help pull node A closer to $V_{DD}$ to provide the PUR circuit with noise immunity by adding hysteresis and decreasing the DC current through inverter $I_1$ by pulling its input close enough to $V_{DD}$ to turn off the p-ch pull-up device in the inverter.

As $V_{DD}$ decreases from 5V towards 0V, $M_1$ and $M_2$ are both on. For $V_{DD} < 1.85V$, $V_A$ (decreasing node voltage curve 522) follows a different path than when $V_{DD}$ is increasing, thus providing hysteresis for stability. Transistors $M_1$ and $M_2$ are sized so that the sum of the current through $M_1$ and $M_2$ keeps $V_A$ above the inverter $I_1$ switch point until $V_{DD}$ drops down to about 1.2V ($=V_F$). Inverter $I_1$ then switches states (from output low to high) and $M_2$ turns off and the voltage at node A follows curve 522 down to 0V. The 300 to 700 mV of hysteresis (i.e., the difference between $V_R$ and $V_F$) added by the use of transistor $M_2$ prevents PUR circuit 300 from continuously switching between reset high and low states due to typical noise on $V_{DD}$ when $V_{DD}$ is near $V_F$ or $V_R$.

Referring now to FIG. 6, there are shown a plurality of waveforms 600 illustrating the operation of the PUR circuit of the present invention. In particular, waveforms 600 include waveforms for $V_{DD}$, the reset signal RSTN, and the voltages at nodes A and B, thus illustrating the complete operation of PUR circuit 300 as a function of time and voltage. The start up process and the power down sequence are both described below.

At time $T_0$, $V_{DD}$ starts increasing from 0V; this begins the start up process or sequence. At $T_1$, the voltage $V_{DD}$ exceeds the minimum level needed for proper logic operation ($V_L$). Node A is at a voltage less than the inverter $I_1$ switching level, so node B switches to $V_{DD}$ and the output of the second inverter $I_2$ (RSTN) is forced to be low. Because node A is already at 0V, due to the connection to $V_{SS}$ via $R_1$, at time $T_1$, as soon as inverter $I_1$ becomes operational, its output instantly goes from indeterminate to high at node B. Thus, the voltage at node B is logic high, i.e., it equals $V_{DD}$ and rises along with $V_{DD}$ during the period from $T_1$ to $T_2$. The output at node B is high enough during the entire period from $T_1$ to $T_2$ to cause inverter $I_2$ to output a logic low reset signal at terminal RSTN. Therefore, during the entire reset period ($T_1$ to $T_2$), when node B is high, the reset signal at terminal RSTN remains low without interruption.

At $T_2$, $V_{DD}$ exceeds the rising trip point ($V_R$) when node A crosses the inverter $I_1$ switching threshold and node B is forced to ground, which also turns on $M_2$ to pull node A up near $V_{DD}$. Node B going low forces the second inverter $I_2$ to change states so RSTN now goes high and follows $V_{DD}$. The supply voltage $V_{DD}$ then ramps up to its steady state maximum value ($V_M$) by time $T_3$.

Time $T_4$ marks the start of the power down sequence with $V_{DD}$ starting to decrease towards 0V. The response of node A from $T_4$ to $T_5$ is shown in detail in FIG. 5 as the region from $V_{DD}$=5V down to $V_{DD}$=$V_F$ (decreasing node voltage curve 522 for the range $V_F$<$V_{DD}$<$V_R$). At $T_5$, node A has crossed the inverter $I_1$ high-to-low switching point and node B goes high. This turns off $M_2$ which forces node A to follow curves 521, 522 of FIG. 5 ($V_{DD}$<$V_F$); in this range these curves are the same since for both, only $M_1$ is on. Node B high forces the second inverter $I_2$ output low and RSTN is thus low for the $T_5$ to $T_6$ interval. After $T_6$ $V_{DD}$ is low enough (below $V_L$) that the inverters $I_1$, $I_2$ no longer operate and nodes B and RSTN are undefined.

Indeterminate or undefined voltages are represented by x's in FIG. 6. The operation of PUR circuit 400 (FIG. 4) is similar to 300. The gate of $M_1$ is connected to $V_{SS}$ to lower the $V_F$ and $V_R$ switch points to be consistent with a 2.5V or smaller power supply.

As will be appreciated, the W/L ratio of transistor $M_1$ and the trip point of inverter $I_1$ determines the rising trip point $V_R$ of PUR circuit 300. The W/L ratio of transistor $M_2$ determines the falling trip point $V_F$, which provides the hysteresis function for stability and noise immunity. Depending on the value of $R_1$ selected and the values $V_R$, $V_F$, and $V_M$ desired or given, the trip point of inverter $I_1$ and the current-conducting properties of transistors $M_1$ and $M_2$ may be adjusted accordingly, by varying appropriate parameters such as the transistors' W/L ratios.

Although the positive power supply rail $V_{DD}$ is shown as rising and falling in a linear ramp, this need not be the case for PUR circuits 300, 400 of the present invention to function, because they sense the DC level of $V_{DD}$, not the $V_{DD}$ ramp rate. Further, because a sufficient DC magnitude of $V_{DD}$=$V_R$ must be reached before the reset period ends, spurious high-frequency noise added to $V_{DD}$ which does not reach magnitude $V_R$ will not cause the reset signal to be deasserted, unlike transient sensing PUR circuits, which can be prone to errors of this kind.

In an alternative embodiment, an active high reset signal RST may be generated by circuits 300, 400, for example by adding another inverting buffer after $I_2$.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. An integrated circuit comprising a DC sensing power-up reset (PUR) circuit, the PUR circuit comprising:
   (a) a first terminal for receiving a supply voltage and a second terminal for receiving a reference voltage corresponding to a low logic state;
   (b) a first transistor coupled between the first terminal and a first node, wherein the first transistor switches on when the supply voltage is rising and exceeds a rising trip point voltage and the first transistor has a gate terminal coupled to the second terminal;
   (c) a second transistor coupled between the first terminal and the first node, wherein the second transistor switches off when the supply voltage falls below a falling trip point voltage which is less than the rising trip point voltage;
   (d) a first inverter coupled at an input terminal to the first node and at an output terminal to a second node; and
   (e) a resistor coupled between the first node and the second terminal for pulling the first node down to the reference voltage while the first and second transistors are both off and for limiting current flowing through the first and second transistors while either or both of the first and second transistors is on.

2. The integrated circuit of claim 1, wherein the first and second transistors are pmos transistors and the second transistor has a gate terminal coupled to the second node.

3. The integrated circuit of claim 1, wherein the first and second transistors are pmos transistors and the first transistor has a gate terminal coupled to the first node.

4. The integrated circuit of claim 1, wherein the first and second transistors are pmos transistors.

5. The integrated circuit of claim 1, wherein, during a power-up phase, the supply voltage increases from ground to a maximum voltage, wherein the rising trip point voltage is less than the maximum voltage.

6. The integrated circuit of claim 1, wherein the first inverter is operational while the supply voltage exceeds a logic voltage which is less than the rising trip point voltage, wherein the logic voltage is the minimum voltage needed for the first inverter to be operational.

7. The integrated circuit of claim 6, wherein the falling trip point voltage is greater than the logic voltage.

8. The integrated circuit of claim 1, further comprising:
   (f) a second inverter coupled at an input terminal to the second node for generating an active-low reset signal at an output terminal.

9. The integrated circuit of claim 8, further comprising a plurality of logic elements powered by the power supply voltage and coupled to the reset signal, wherein each such logic element is reset to an initial state in accordance with the reset signal.

10. The integrated circuit of claim 1, wherein the current is a DC current flowing through the first and second transistors from a power supply that provides the supply voltage.

11. In an integrated circuit comprising a DC sensing power-up reset (PUR) circuit, a method for generating a reset signal, the method comprising the steps of:
   (a) receiving a supply voltage at a first terminal of the PUR circuit and a reference voltage corresponding to a low logic state at a second terminal of the PUR circuit;
   (b) coupling the first terminal and a first node with a first transistor when the supply voltage is rising and exceeds a rising trip point voltage;
   (c) coupling the first terminal and the first node with a second transistor when the supply voltage is falling and has not fallen below a falling trip point voltage which is less than the rising trip point voltage;
   (d) limiting, with a resistor coupled between the first node and the second terminal, current flowing through the first and second transistors while the first terminal is coupled to the first node; and
   (e) generating a reset signal having a first logic state when the first terminal is coupled to the first node and having a second logic state when the first terminal is not coupled to the first node, wherein the PUR circuit comprises a first inverter coupled at an input terminal to the first node and at an output terminal to a second node, and a second inverter coupled at an input terminal to the second node, wherein the second inverter generates the reset signal at an output terminal, wherein the reset signal is an active low reset signal, wherein the first transistor has a gate terminal coupled to the second terminal.

12. The method of claim 11, comprising the further step of pulling the first node down to the reference voltage, with the resistor, while the first terminal is not coupled to the first node.

13. The method of claim 11, comprising the further step of increasing, during a power-up phase, the supply voltage from ground to a maximum voltage, wherein the rising trip point voltage is less than the maximum voltage.

14. The method of claim 11, wherein the first and second transistors are pmos transistors and the second transistor has a gate terminal coupled to the second node.

15. The method of claim 11, wherein the first and second transistors are pmos transistors and the first transistor has a gate terminal coupled to the first node.

16. The method of claim 11, wherein the first and second transistors are pmos transistors.

17. The method of claim 11, wherein the first and second inverters are operational while the supply voltage exceeds a logic voltage which is less than the rising trip point voltage, wherein the logic voltage is the minimum voltage needed for the first and second inverters to be operational, wherein the falling trip point voltage is greater than the logic voltage.

18. The method of claim 11, wherein the integrated circuit comprises a plurality of logic elements powered by the power supply voltage and coupled to the reset signal, further comprising the step of resetting each such logic element to an initial state in accordance with the reset signal.

19. The method of claim 11, wherein the current is a DC current flowing through the first and second transistors from a power supply that provides the supply voltage.

20. An integrated circuit comprising a DC sensing power-up reset (PUR) circuit, the PUR circuit comprising:
   (a) a first terminal for receiving a supply voltage and a second terminal for receiving a reference voltage corresponding to a low logic state;
   (b) a first transistor coupled between the first terminal and a first node, wherein the first transistor switches on when the supply voltage is rising and exceeds a rising trip point voltage;
   (c) a second transistor coupled between the first terminal and the first node, wherein the second transistor switches off when the supply voltage falls below a falling trip point voltage which is less than the rising trip point voltage;
   (d) a first inverter coupled at an input terminal to the first node and at an output terminal to a second node, wherein the first inverter is operational while the supply voltage exceeds a logic voltage which is less than the rising trip point voltage, wherein the logic voltage is the minimum voltage needed for the first inverter to be operational; and
   (e) a resistor coupled between the first node and the second terminal for pulling the first node down to the reference voltage while the first and second transistors are both off and for limiting current flowing through the first and second transistors while either or both of the first and second transistors is on.

21. In an integrated circuit comprising a DC sensing power-up reset (PUR) circuit, a method for generating a reset signal, the method comprising the steps of:
   (a) receiving a supply voltage at a first terminal of the PUR circuit and a reference voltage corresponding to a low logic state at a second terminal of the PUR circuit;
   (b) coupling the first terminal and a first node with a first transistor when the supply voltage is rising and exceeds a rising trip point voltage;
   (c) coupling the first terminal and the first node with a second transistor when the supply voltage is falling and has not fallen below a falling trip point voltage which is less than the rising trip point voltage;
   (d) limiting, with a resistor coupled between the first node and the second terminal, current flowing through the first and second transistors while the first terminal is coupled to the first node; and
   (e) generating a reset signal having a first logic state when the first terminal is coupled to the first node and having a second logic state when the first terminal is not coupled to the first node, wherein the PUR circuit comprises a first inverter coupled at an input terminal to the first node and at an output terminal to a second node, and a second inverter coupled at an input terminal to the second node, wherein the second inverter generates the reset signal at an output terminal, wherein the reset signal is an active low reset signal, further wherein the first and second inverters are operational while the supply voltage exceeds a logic voltage which is less than the rising trip point voltage, wherein the logic voltage is the minimum voltage needed for the first and second inverters to be operational, wherein the falling trip point voltage is greater than the logic voltage.

* * * * *